(12) United States Patent
Yamaguchi et al.

(10) Patent No.: US 8,222,324 B2
(45) Date of Patent: Jul. 17, 2012

(54) PROCESS FOR PRODUCING MODIFIED EPOXY RESIN

(75) Inventors: Katsumi Yamaguchi, Takasago (JP);
Masakuni Ueno, Takasago (JP);
Masahiro Miyamoto, Takasago (JP)

(73) Assignee: Kaneka Corporation, Osaka (JP)

( * ) Notice: Subject to any disclaimer, the term of this patent is extended or adjusted under 35 U.S.C. 154(b) by 1139 days.

(21) Appl. No.: 10/558,759

(22) PCT Filed: May 27, 2004

(86) PCT No.: PCT/JP2004/007679
§ 371 (c)(1),
(2), (4) Date: Dec. 1, 2005

(87) PCT Pub. No.: WO2004/108825
PCT Pub. Date: Dec. 16, 2004

(65) Prior Publication Data
US 2007/0027233 A1    Feb. 1, 2007

(30) Foreign Application Priority Data
Jun. 9, 2003  (JP) ................................. 2003-164416

(51) Int. Cl.
*C08F 255/00*    (2006.01)
(52) U.S. Cl. ........................................ 523/436; 523/400
(58) Field of Classification Search ................... 523/436
See application file for complete search history.

(56) References Cited

U.S. PATENT DOCUMENTS

| | | | |
|---|---|---|---|
| 3,856,883 A | 12/1974 | Dickie et al. | |
| 3,957,912 A * | 5/1976 | Cincera | 525/257 |
| 4,360,620 A * | 11/1982 | Lindner et al. | 524/234 |
| 4,778,851 A | 10/1988 | Henton et al. | |
| 4,921,909 A * | 5/1990 | Sugimori et al. | 525/64 |
| 5,100,954 A * | 3/1992 | Itoh et al. | 524/805 |
| 5,122,397 A * | 6/1992 | Hisaki et al. | 427/412 |
| 5,159,010 A * | 10/1992 | Mori et al. | 524/510 |
| 6,331,591 B1 * | 12/2001 | Miyamoto et al. | 525/70 |
| 6,395,829 B1 * | 5/2002 | Miyamoto et al. | 525/71 |
| 6,525,135 B1 * | 2/2003 | Nagata et al. | 525/70 |
| 2008/0051524 A1 * | 2/2008 | Ji et al. | 525/476 |

FOREIGN PATENT DOCUMENTS

| | | |
|---|---|---|
| JP | 3-26716 A | 2/1991 |
| JP | 5-295237 A | 11/1993 |
| JP | 2002-30122 A | 1/2002 |

OTHER PUBLICATIONS

Extended European Search Report dated Nov. 4, 2010, corresponding to European Patent Application No. EP 10176326.6.

* cited by examiner

*Primary Examiner* — Peter F Godenschwager
(74) *Attorney, Agent, or Firm* — Sughrue Mion, PLLC

(57) ABSTRACT

This invention provides a process for producing an epoxy resin composition having core/shell rubber particles (rubber-like polymer particles) dispersed in an epoxy resin, wherein an epoxy resin composition excellent in the dispersed state of rubber-like polymer particles in an epoxy resin with a reduced amount of contaminants is produced easily and efficiently.

The epoxy resin composition having rubber-like polymer particles dispersed well in an epoxy resin with less contaminant is obtained by bringing an aqueous latex of rubber-like polymer particles (B) into contact with an organic medium (C) showing partial solubility in water, then bringing an organic medium (D) having lower partial solubility in water than that of the organic medium (C) into contact therewith to separate water substantially, to remove the rubber-like polymer particles as a dispersion (F) having the polymer particles dispersed in the organic medium, and mixing it with an epoxy resin (A), followed by distilling volatile components away.

9 Claims, No Drawings

US 8,222,324 B2

PROCESS FOR PRODUCING MODIFIED EPOXY RESIN

RELATED APPLICATION

This application is a national stage of International Application No. PCT/JP2004/007679, filed on May 27, 2004, claiming priorities based on Japanese Application No. 2003-164416 filed on Jun. 9, 2003, the contents of all of which are incorporated herein by reference in their entirety.

TECHNICAL FIELD

The present invention relates to a process for producing a rubber-modified epoxy resin composition.

BACKGROUND ART

A cured product of epoxy resin is superior in many aspects such as dimensional stability, mechanical strength, electrical insulating properties, heat resistance, water resistance and chemical resistance. However, the cured product of epoxy resin is poor in fracture toughness and may show very brittle properties, and such properties are often problematic in various uses.

As a means to solve these problems, incorporation of rubber components into the epoxy resin has been conventionally conducted. In particular, a method of incorporating rubber-like polymer particles previously prepared in the form of particles by using a polymerization method in an aqueous medium, represented by emulsion polymerization, dispersion polymerization and suspension polymerization, is considered advantageous in principle in that a dispersed state is hardly changed under blending and curing conditions, a continuous phase of a cured product of epoxy resin is not contaminated with rubber components by previously crosslinking the rubber components, so that heat resistance and toughness are hardly reduced, as compared with a method of forming a dispersed phase of rubber components in a continuous phase of a cured product of epoxy resin by causing phase separation during a curing process after dissolving and mixing non-crosslinked rubber components with epoxy resin, and thus the following various production methods have been proposed.

(1) A method which comprises milling a coagulated material of a rubber-like polymer latex and then mixing it with an epoxy resin (for example, Jp-A 5-295237 and Japanese patent No. 2751071).

(2) A method which comprises mixing a rubber-like polymer latex with an epoxy resin and then distilling water away to give a mixture (see, for example, Jp-A 6-107910).

(3) A method which comprises mixing a rubber-like polymer latex with an epoxy resin in the presence of an organic solvent to give a mixture (see, for example, U.S. Pat. No. 4,778,851).

Usually when rubber-like polymer particles obtained as aqueous latex are to be mixed and dispersed in an epoxy resin, the rubber-like polymer should be separated from water.

In the method (1), the rubber-like polymer is separated from water by isolating it once as a coagulated material, but handling of this material and the step of mixing it with an epoxy resin are complicated and industrially not preferable. When the rubber-like polymer removed once as a coagulated material is to be mixed and re-dispersed in an epoxy resin, the rubber-like polymer particles are hardly re-dispersed in the form of primary particles in the epoxy resin, even by using a milling or dispersing procedure with significant mechanical shear force.

In the method (2), the epoxy resin is hardly mixed with water so that a part of the resin not mixed with water is dried to form a resin chunk, which unless removed, adversely affects qualities. In addition, a large amount of water should be removed in the presence of the epoxy resin, to make the procedure difficult.

In the method (3), while mixing the rubber-like latex with the epoxy resin, a large amount of water (an excess of water which cannot be dissolved in an organic solvent) present in the mixture in the system together with an organic solvent should be separated or distilled away, but the separation of the aqueous layer from the organic solvent layer requires much time such as whole day, or is substantially difficult because the organic solvent layer and the aqueous layer form a stable emulsified or suspended state. When water is to be distilled away, a large amount of energy is necessary, and water-soluble contaminants such as an emulsifier, auxiliary materials etc. used usually in production of the rubber-like polymer latex remain in the composition to make it inferior in qualities. Accordingly, removal of water by either method of separating or distilling water is troublesome and industrially not preferable.

DISCLOSURE OF THE INVENTION

The object of the present invention is to provide an easy and efficient process for producing a rubber-modified epoxy resin composition having rubber-like polymer particles incorporated into an epoxy resin, which comprises separating water efficiently from the rubber-like polymer particles obtained in the state of an aqueous latex without isolating the particles as a coagulated material, and then mixing the rubber-like polymer particles with an epoxy resin, wherein the rubber-like polymer particles can be mixed and dispersed uniformly in the epoxy resin, while contaminants such as an emulsifier added at the time of polymerization of the rubber-like polymer particles can be removed simultaneously.

That is, the present invention relates to a process for producing an epoxy resin composition having rubber-like polymer particles (B) dispersed and mixed stably in an epoxy resin (A), which comprises-bringing an organic medium (C) showing partial solubility in water into contact with an aqueous latex of rubber-like polymer particles (B), then bringing an organic medium (D) having lower partial solubility in water than that of (C) into contact therewith to separate an aqueous layer substantially from the rubber-like polymer particles (B), mixing the resulting dispersion (F) comprising the rubber-like polymer particles (B) and the mixed organic mediums (C) and (D), with an epoxy resin (A), and removing volatile components.

In the process of the present invention, it is preferable that before the dispersion (F) is mixed with the epoxy resin (A), the dispersion (F) is washed by bringing it at least once into contact with water, and it is more preferable also that after the organic medium (C) showing partial solubility in water is brought into contact with the aqueous latex of rubber-like polymer particles (B) and before the organic medium (D) is brought into contact therewith, the dispersion is brought into contact with water at least once.

It is also preferable that the solubility of water in the organic medium (C) showing partial solubility in water is preferably 9 to 40% by weight, and also that the organic mediums (C) and (D) are a combination not forming two-component azeotropic mixture.

It is preferable that the rubber-like polymer particles (B) in the process of the invention are obtained by graft-polymerizing 5 to 50% by weight of a shell layer (B-2) comprising at least one monomer selected from the group consisting of (meth)acrylates, aromatic vinyls, vinyl cyanides, unsaturated acid derivatives, (meth) acrylamide derivatives and maleimide derivatives, with 50 to 95% by weight of a rubber particle core (B-1) comprising elastic materials composed of not less than 50% by weight of at least one monomer selected from the group consisting of diene monomers and (meth)acrylate monomers and less than 50% by weight of another copolymerizable vinyl monomer, or polysiloxane rubber elastic materials, or a mixture thereof, and it is more preferable that the shell layer (B-2) in the rubber-like polymer particle (B) comprises as a constitutional element a monomer having reactivity with an epoxy resin or a curing agent at the time of curing reaction of the epoxy resin.

Further, the present invention relates to a dispersion (F) comprising rubber-like polymer particles (B) and organic mediums (C) and (D), which is obtained by bringing an organic medium (C) showing partial solubility in water into contact with an aqueous latex of rubber-like polymer particles (B) and then bringing an organic medium (D) having lower partial solubility in water than that of (C) into contact therewith to separate an aqueous layer substantially from the rubber-like polymer particles (B).

In addition, the present invention relates to an epoxy resin composition obtained by the above-described process for producing an epoxy resin composition and also to a cured molded product comprising the epoxy resin composition cured with a curing agent.

The present invention relates to a production process wherein an epoxy resin composition comprising the rubber-like polymer particles (B) dispersed stably in the epoxy resin (A) is obtained. The present invention relates in particular to a production process wherein the rubber-like polymer (B) obtained in the state of an aqueous latex is easily and efficiently mixed and dispersed in the epoxy resin (A). The epoxy resin composition obtained by the present invention is an epoxy composition comprising the rubber-like polymer particles (B) well dispersed in the epoxy group-containing liquid resin (A).

The epoxy resin (A used in the present invention is a prepolymer having an epoxy group. The epoxy resin which can be used in the present invention is an epoxy resin also called polyepoxide. An example thereof is a bisphenol A diglycidyl ether, novolak epoxy resin, tri- or tetrafunctional epoxy resin, polymerized epoxy resin (for example, diglycidyl ether of polymerized bisphenol A) or homopolymer or copolymer obtained by polymerizing unsaturated monoepoxide (for example, glycidyl (meth)acrylate, allyl glycidyl ether).

The polyepoxide used in the present invention includes glycidyl ether of polyvalent alcohol and polyvalent phenol, polyglycidyl amine, polyglycidyl amide, polyglycidyl imide, polyglycidyl hydantoin, polyglycidyl thioether, epoxidated fatty acid or epoxidated dry oil, epoxidated polyolefin, epoxidated unsaturated polyester, and a mixture thereof. Many polyepoxides synthesized from polyvalent phenol are disclosed in for example U.S. Pat. No. 4,431,782. The polyepoxide is synthesized from monovalent, divalent or trivalent phenol, and also includes novolak resin. The polyepoxide also includes polyepoxides consisting of a polymer or copolymer of glycidyl (meth)acrylate or allyl glycidyl ether in addition to epoxidated cycloolefin. Preferable examples of the polyepoxide include those described in U.S. Pat. Nos. 3,804,735, 3,892,819, 3,948,698, and 4,014,771 and "Epoxy Resin Handbook" (The Nikkan Kogyo Shimbun Ltd., 1987).

The poly epoxide used in the present invention is as described above, and includes polyepoxides generally having an epoxy equivalent weight of 80 to 2000. These polyepoxides can be obtained by a known method, generally by a method of reacting an excess of epihalohydrin with a polyvalent alcohol or polyvalent phenol.

The polyepoxide used in the present invention may contain a monoepoxide, for example aliphatic or aromatic glycidyl ether such as butyl glycidyl ether, phenyl glycidyl ether or glycidyl glycidyl ether as a reactive diluent. As is generally known, the monoepoxide affects the stoichiometry of a polyepoxide composition, which can be adjusted by the amount of a curing agent or by other known methods.

The epoxy resin (A) used in the present invention can also contain a curing agent and/or a curing accelerator for the epoxy group-containing compound, but such additives are desired not to substantially cause an unintended curing reaction with the epoxy resin under the production conditions in the present invention. As the curing agent and/or curing accelerator, only those described in the above-mentioned Epoxy Resin Handbook and satisfying the requirements of the present invention can be used.

In the process for producing the epoxy resin composition according to the present invention, the rubber-like polymer particles (B) are preferably made of a core/shell polymer composed of the rubber particle core (B-1) comprising a polymer based on an elastomer or a rubber-like polymer and the shell layer (B-2) comprising a polymer component graft-polymerized therewith.

The polymer constituting the rubber particle core (B-1) is cross linked, and the polymer constituting the rubber-like core (B-1) can be swollen with, but is not substantially dissolved in, a suitable solvent. The rubber particle core (B-1) is insoluble in the epoxy resin (A). The content of gel in the rubber particle core (B-1) is not less than 60% by weight, preferably not less than 80% by weight, still more preferably not less than 90% by weight, further still more preferably not less than 95% by weight. The glass transition temperature (Tg) of the polymer constituting the rubber particle core (B-1) is 0° C. or less, preferably −100° C. or less.

The polymer constituting the rubber particle core (B-1) preferably comprises elastic materials composed of not less than 50% by weight of at least one monomer selected from the group consisting of a diene monomer (conjugated diene monomer) and a (meth) acrylate monomer and less than 50% by weight of another copolymerizable vinyl monomer, or polysiloxane rubber elastic materials, or a mixture thereof. In the present invention, (meth)acryl means acryl and/or methacryl.

The conjugated diene monomer constituting the elastic materials includes, for example, butadiene, isoprene, chloroprene etc., among which butadiene is particularly preferable. The (meth)acrylate monomer includes, for example, butyl acrylate, 2-ethylhexyl acrylate, lauryl methacrylate etc., among which butyl acrylate and 2-ethylhexyl acrylate are particularly preferable. These can be used alone or as a mixture of two or more thereof.

The amount of at least one kind of monomer selected from the group consisting of a conjugated diene monomer and a (meth)acrylate monomer is preferably not less than 50% by weight, more preferably not less than 60% by weight, based on the total weight of the elastic materials. When the amount of the monomer used is less than 50% by weight, the rigidity improvement effect of the epoxy resin composition of the present invention tends to be lowered.

Further, the elastic materials may be composed not only of the conjugated diene monomer or (meth) acrylate monomer but also of a copolymer thereof with a vinyl monomer copolymerizable therewith. The vinyl monomer copolymerizable with the conjugated diene monomer or (meth)acrylate monomer includes monomers selected from the group consisting of an aromatic vinyl monomer and a vinyl cyanide monomer. The aromatic vinyl monomer includes, for example, styrene, α-methylstyrene and vinyl naphthalene, and the vinyl-cyanide monomer includes, for example, (meth)acrylonitrile and substituted acrylonitrile. These can be used alone or in combination thereof.

The amount of these copolymerizable vinyl monomers used is preferably less than 50% by weight, more preferably less than 40% by weight, based on the total weight of the elastic materials.

To adjust the degree of crosslinkage, a multifunctional monomer may be contained as a component constituting the elastic materials. Examples of the multifunctional monomer include divinyl benzene, butane diol di(meth)acrylate, triallyl (iso)cyanurate, allyl (meth)acrylate, diallyl itaconate, diallyl phthalate etc. The amount of the multifunctional monomer used is not higher than 10% by weight, preferably not higher than 5% by weight, more preferably not higher than 3% by weight, based on the total weight of the elastic materials. When the amount of the multifunctional monomer used is higher than 10% by weight, the rigidity improvement effect of the epoxy resin composition of the present invention tends to be lowered.

To adjust the molecular weight or crosslinking degree of the polymers constituting the elastic materials, a chain transfer agent may be used, and for example C5 to C20 alkyl mercaptan can be mentioned. The amount of the chain transfer agent used is not higher than 5% by weight, more preferably not higher than 3% by weight, based on the total weight of the rubber particle core (B-1). It is not preferable that the amount of the chain transfer agent used is higher than 5% by weight, because the amount of non-crosslinked components in the rubber particle core (B-1) is increased, which may adversely affect the heat resistance, rigidity etc. of a cured epoxy resin product obtained by using the epoxy resin composition of the present invention.

As the rubber particle core (B-1), polysiloxane rubber type elastic materials can be substituted for, or used in combination with, the elastic materials. When the polysiloxane rubber type elastic materials are used as the rubber particle core (B-1), polysiloxane rubber composed of di-alkyl or aryl substituted silyloxy units such as dimethyl silyloxy, methylphenyl silyloxy and diphenyl silyloxy can be used. When the polysiloxane rubber-mentioned above is used, it is preferable to introduce previously a cross linked structure into it by using a multifunctional alkoxy silane compound partially in combination therewith during polymerization or by radically reacting a silane compound having a vinyl reactive group introduced in it or using other methods, if necessary.

The shell layer (B-2) gives affinity for epoxy resin so that the rubber-like polymer particles (B) can be dispersed stably in the form of primary particles in the epoxy resin.

The polymer constituting the shell layer (B-2) has been graft-polymerized with the polymer constituting the rubber particle core (B-1) and substantially bonded to the polymer constituting the rubber particle core (B-1). It is desired that preferably not less than 70% by weight, more preferably not less than 80% by weight and still more preferably not less than 90% by weight of the polymer constituting the shell layer (B-2) is bonded to the rubber particle core (B-1).

The shell layer (B-2) is preferably having the swellability or miscibility or affinity to the organic medium (C) and epoxy resin (A) described later. Depending on necessity in use, the shell layer (B-2) may contain monomers reactive with the epoxy resin (A) or with a curing agent incorporated for use. A functional group of the reactive monomer contained in the shell layer (B-2) is preferably the one capable of chemically reacting with the epoxy resin (A) or the curing agent to form a linkage under conditions where the epoxy resin (A) is cured by reaction with the curing agent.

From the viewpoint of availability and affinity for the organic solvent (C), the polymer constituting the shell layer (B-2) is preferably a polymer or copolymer obtained by copolymerizing at least one component selected from alkyl(meth)acrylate, an aromatic vinyl compound and a vinyl cyanide compound. Particularly when the shell layer (B-2) is desired to be chemically reactive at the time of curing the epoxy resin, it is preferable from the viewpoint of high reactivity with the epoxy group or the epoxy curing agent that the polymer constituting the shell layer (B-2) is made of at least one kind of monomer selected from the group consisting of (meth)acrylates having a reactive side chain, such as hydroxyalkyl (meth)acrylate, aminoalkyl (meth)acrylate and epoxyalkyl (meth)acrylate, epoxy alkyl vinyl ethers, unsaturated acid derivatives, (meth)acrylamide derivatives and maleimide derivatives, in addition to the alkyl (meth)acrylate, aromatic vinyl compound or vinyl cyanide compound.

The alkyl (meth)acrylate includes, for example, methyl (meth)acrylate, ethyl (meth)acrylate, butyl (meth)acrylate, 2-ethylhexyl (meth)acrylate, etc. The aromatic vinyl includes styrene, α-methylstyrene etc. The vinyl cyanide includes (meth)acrylonitrile etc.

The (meth)acrylate having a reactive side chain includes, for example, 2-hydroxyethyl (meth)acrylate, 2-aminoethyl (meth)acrylate and glycidyl (meth)acrylate. The epoxy alkyl vinyl ether includes glycidyl vinyl ether. The unsaturated acid derivative includes α, β-unsaturated acids, α, β-unsaturated acid anhydrides, (meth)acrylic acid, itaconic acid and crotonic acid. The (meth)acrylamide derivative includes (meth)acrylamide (including N-substituted derivatives thereof). The maleimide derivative includes maleic anhydride and maleic imide. These can be used alone or in combination thereof.

The ratio (by weight) of the rubber particle core (B-1)/shell layer (B-2) in the rubber-like polymer particle (B) is in the range of preferably 50/50 to 95/5, more preferably 60/40 to 90/10. When the (B-1)/(B-2) ratio is outside of 50/50 to decrease the ratio of the rubber particle core (B-1), the rigidity improvement effect of the epoxy resin composition of the present invention tends to be decreased. When the ratio is outside of 95/5 to decrease the ratio of the shell layer (B-2), flocculation easily occurs at the time of handling in the process of the present invention causing a problem in operability and thus desired physical properties may not be obtained.

The rubber-like polymer particles (B) can be produced by a method known in the art, such as emulsion polymerization, suspension polymerization, micro-suspension polymerization etc. In particular, a process by emulsion polymerization is preferable.

An emulsifier or dispersion used in the aqueous medium is preferably the one whose emulsion stability is not deteriorated even if the aqueous latex is neutral. Concrete examples include alkali metal salts or ammonium salts of various acids such as alkyl or aryl sulfonic acid represented by dioctylsulfosuccinic acid and dodecylbenzenesulfonic acid, alkyl or aryl ether sulfonic acid, alkyl or aryl sulfuric acid represented by dodecylsulfuric acid, alkyl or aryl ether sulfuric acid, alkyl or aryl substituted phosphoric acid, alkyl or aryl ether substituted phosphoric acid, N-alkyl or aryl sarcosine acid represented by dodecyl sarcosine acid, alkyl or aryl carboxylic acid represented by oleic acid and stearic acid, and alkyl or aryl ether carboxylic acids, nonionic emulsifiers or dispersion such as alkyl or aryl substituted polyethylene glycols, and dispersion such as polyvinyl alcohols, alkyl substituted cellulose, polyvinyl pyrrolidone, and polyacrylic acid derivatives. These can be used alone or as a mixture of two or more thereof.

According to a preferable embodiment of the present invention, the emulsifier or dispersant is used more preferably in the minimum amount in such a range that dispersion stability is not hindered in the process of producing the rubber-like polymer particles (B) latex. In the production process of the present invention, more preferably, the emulsifier or dispersant has properties that the emulsifier or dispersant is extracted and washed with an aqueous layer to such an extent that the residual amount does not influence the physical properties of the epoxy resin composition to be produced.

In the process for producing the epoxy resin composition of the present invention, the diameter of the rubber-like polymer particles (B) is not particularly limited insofar as the rubber-like polymer particles (B) can be stably obtained in the form of an aqueous latex, but from the viewpoint of industrial productivity, the average particle diameter is preferably about 0.03 to 2 µm, more preferably about 0.05 to 1 µm, for easier production.

In the process for producing the epoxy resin composition according to the present invention, the content of the rubber-like polymer particles (B) is not particularly limited. The resulting epoxy resin composition can also be used as a master batch which is used after being diluted with an epoxy resin so as to attain a desired amount of the rubber-like polymer particles (B). The epoxy resin used in dilution may be the same kinds as, or different if necessary from, the epoxy resin (A) in the composition. Assuming that the total amount of the epoxy resin (A) and rubber-like polymer particles (B) in the epoxy resin composition is 100% by weight, the content of the rubber-like polymer particles (B) is for example 0.5 to 80% by weight, preferably 1 to 70% by weight, more preferably 3 to 60% by weight, still more preferably 3 to 50% by weight. When the amount of the rubber-like polymer particles (B) is less than 0.5% by weight, the rigidity improvement effect of the epoxy resin composition of the present invention tends to be lowered, while when the amount is higher than 80% by weight, the viscosity of the epoxy resin composition tends to be significantly increased to hinder the operation in the process.

The organic medium (C) showing partial solubility in water, used in the present invention, should be an organic medium achieving mixing without coagulating and precipitating the rubber-like polymer particles (B), when an aqueous latex of the rubber-like polymer particles (B) is brought into contact with the organic medium (C).

The organic medium (C) showing partial solubility in water, used in the present invention, is at least one kind of organic solvent or a mixture thereof, preferably an organic solvent or an organic solvent mixture in which the solubility of water in the organic solvent (C) at 25° C. is 9 to 40% by weight, preferably 10 to 30% by weight. When the solubility of water in the organic solvent (C) is higher than 40% by weight, the rubber-like polymer particles (B) easily coagulate to hinder the procedure upon mixing the organic medium (C) with the aqueous latex of the rubber-like polymer particles (B), and the amount of water in the mixture (F) as the organic layer tends to be increased. When the solubility of water is less than 9% by weight, a larger amount of the rubber-like polymer particles (B) tends to remain in the aqueous layer even after the organic medium (D) is mixed therewith.

The organic medium (C) is preferably at least one kind of organic solvent satisfying water solubility in the above range, selected from esters such as methyl acetate, ethyl acetate, propyl acetate and butyl acetate, ketones such as acetone, methyl ethyl ketone, diethyl ketone and methyl isobutyl ketone, alcohols such as ethanol, (iso) propanol and butanol, ethers such as tetrahydrofuran, tetrahydropyran, dioxane and diethyl ether, aromatic hydrocarbons such as benzene, toluene and xylene, and halogenated hydrocarbons such as methylene chloride and chloroform, or a mixture thereof. Especially, an organic solvent mixture containing methyl ethyl ketone in an amount of preferably at least 50% by weight, more preferably at least 75% by weight is particularly preferable.

The amount of the organic medium (C) can be varied depending on the type of the rubber-like polymer particles (B) and the amount of the rubber-like polymer particles (B) in the aqueous latex of (B), but is preferably 50 to 350 parts by weight, more preferably 70 to 250 parts by weight, still more preferably 50 to 200 parts by weight, relative to 100 parts by weight of the latex of the rubber-like polymer particles (B). When the amount of the organic medium (C) is less than 50 parts by weight, the amount of the organic medium (C) forming the organic medium layer tends to be decreased depending on the type of the organic medium (C), thus making handling of the organic medium layer difficult. When the amount is higher than 350 parts by weight, the amount of the organic solvent (C) removed is increased thus lowering production efficiency.

The organic solvent (D) having lower partial water solubility than that of (C) is preferably an organic solvent, or a mixture of two or more organic solvents, wherein the solubility of water in the organic solvent (D) at 25° C. is not higher than 8% by weight, preferably not higher than 6% by weight, more preferably not higher than 4% by weight. When the solubility of water in the organic medium (D) is higher than 9% by weight, the effect of promoting separation of the organic layer from the aqueous layer may be insufficient.

The organic medium (D) is preferably at least one kind of organic solvent satisfying water solubility in the above range, selected from esters such as ethyl acetate, propyl acetate and butyl acetate, ketones such as diethyl ketone and methyl isobutyl ketone, ethers such as diethyl ether and butyl ether, aromatic hydrocarbons such as benzene, toluene and xylene, aliphatic hydrocarbons such as hexane, and halogenated hydrocarbons such as methylene chloride and chloroform, or a mixture thereof.

The organic medium (D) can be used in such an amount as to be effective in promoting the separation of the organic medium layer from the aqueous layer. Assuming that the amount of the organic medium (C) is 100 parts by weight, the amount of the organic medium (D) is preferably 20 to 1000 parts by weight, more preferably 50 to 400 parts by weight, still more preferably 50 to 200 parts by weight. When the amount of the organic medium (D) is less than 20 parts by weight, the effect of promoting the separation of the organic layer from the aqueous layer tends to be insufficient, while when the amount is higher than 1000 parts by weight, the amount of the organic medium removed tends to be increased thus lowering production efficiency.

The combination of the organic medium (C) and the organic medium (D) is preferably a combination of (C) and (D) satisfying the above requirements and not forming two-component azeotropic mixture, from the viewpoint of facilitating the recovery, separation and re-use of the organic medium in industrial production. Such combination includes, for example, a combination of methyl ethyl ketone and methyl isobutyl ketone, but the present invention is not limited thereto.

In the process for producing the epoxy resin composition in the present invention, the rubber-like polymer particles (B) obtained in the form of an aqueous latex are separated efficiently from water without isolating as a coagulated material, and then mixed with the epoxy resin (A). Specifically, from the state of the aqueous latex having the rubber-like polymer particles (B) dispersed in the aqueous layer, the rubber-like polymer particles (B) are extracted once as the dispersion (F) having the rubber-like polymer particles (B) dispersed stably in a layer made of two kinds of organic mediums (C) and (D) (referred to hereinafter as the mixed organic medium layer) and then mixed with the epoxy resin (A).

In other words, two kinds of organic mediums (C) and (D) which are different ion partial water solubility satisfying the requirements of the present invention are successively brought into contact with the aqueous latex of the rubber-like polymer particles (B) according to the process of the present invention, thereby separating the mixture in a short time into two layers comprising a layer of the organic mediums (C) and (D) (mixed organic medium layer) and a layer mainly based on water (referred to hereinafter as the aqueous layer). The rubber-like polymer particles (B) can thereby be removed as dispersion (F) having (B) dispersed stably in the mixed organic medium layer made of the organic mediums (C) and (D).

In the present invention, the aqueous latex of the rubber-like polymer particles (B) is first brought into contact with the organic medium (C) showing partial water solubility, to form a mixture (referred to hereinafter as mixture (E)) having the rubber-like polymer particles (B) extracted from the latex-derived aqueous layer to the layer based on the organic medium (C). In this step, water derived from the aqueous latex of the rubber-like polymer particles (B) forms an aqueous layer in the mixture (E), and a part of this aqueous layer, or substantially a large part thereof depending on the case, is emulsified, dispersed and mixed in the layer based on the organic medium (C) containing the extracted rubber-like polymer particles (B) so that the mixed water is hardly separated even if the mixture is left for a long time.

Then, the organic medium (D) having lower partial water solubility than that of the organic medium (C), in other words, more hydrophobic, is brought into contact with the mixture (E) thus obtained, whereby the water emulsified, dispersed and mixed in the layer based on the organic medium (C) can be separated. By contacting with the highly hydrophobic-organic medium (D), the hydrophobicity of the mixed organic medium layer formed by mixing the organic mediums (C) and (D) is increased, and in a layer based on the organic medium (C) in the mixture (E), a large amount of emulsified and dispersed water derived from the latex of rubber-like polymer particles (B) is excluded (from organic layer) to the aqueous layer, and prevented from a part of the aqueous layer being re-emulsified, dispersed or mixed in the mixed organic medium layer, or the mixed organic medium layer is prevented from being emulsified and dispersed in the aqueous layer.

The mixed organic medium layer thus obtained, namely, the dispersion (F) comprising the rubber-like polymer particles (B) and a mixed organic medium of the organic mediums (C) and (D), occurs in such a state that the rubber-like polymer (B) is dispersed stably in the mixed organic medium of the organic mediums (C) and (D). In a preferable embodiment of the present invention, the rubber-like polymer particles (B) are dispersed as substantially primary particles in the dispersion (F).

The amount of the rubber-like polymer particles (B') contained in the aqueous layer separated by this procedure is preferably not higher than 5% by weight, more preferably not higher than 3% by weight, based on the total amount of the rubber-like polymer particles (B), and most preferably the rubber-like polymer particles (B') are substantially not contained.

When the more hydrophobic organic medium (D) (than organic medium (C)) is brought into contact with the aqueous latex of the rubber-like polymer particles (B) before the organic medium (C) showing partial water solubility is brought into contact with the aqueous latex, the mixture (E) having the rubber-like polymer particles (B) extracted in the organic medium based on the organic medium (D) cannot be obtained.

The contact in the above procedure includes not only contact in the interface between the aqueous latex of the rubber-like polymer particles (B), the organic medium (C) or the mixture (E) and the organic medium (D), but also mixing of the two under gentle stirring conditions, and a special device or method is not required, and a device or method attaining suitable mixing conditions may be used.

Subsequently, the dispersion (F) obtained through these procedures is mixed with the epoxy resin (A). This mixing can be easily achieved by a known method without using a special equipment or method. The mixing can be carried out for example by a method or under conditions used in dissolving an epoxy resin in an organic solvent. In a series of these procedures, the rubber-like polymer particles (B) do not cause irreversible agglomeration, and before and after mixing with the epoxy resin (A), the rubber-like polymer particles (B) maintain an finely dispersed state. In a preferable embodiment of the present invention, the rubber-like polymer particles (B) maintain an independently dispersed state of substantially primary particles before and after mixing with the epoxy resin (A).

Further, volatile components based on the organic mediums (C) and (D) are removed from the mixture of the dispersion (F) and epoxy resin (A), whereby the desired epoxy resin composition maintaining a fine dispersion of the rubber-like polymer particles (B) in the epoxy resin (A) can be obtained. As the method of removing volatile components, methods known in the arts are applicable. For example, the method includes, but is not limited to, a batch method wherein the mixture is introduced into a vessel and heated at normal pressure or under reduced pressure to distill volatile components away, a method wherein a dry gas is brought into contact with the mixture, a continuous method of using an evaporator of thin film type, and a method of using an extruder equipped with a volatilization device or a continuous stirring vessel. The conditions such as temperature and necessary time for removing volatile components can be suitably selected in such a range that the epoxy resin (A) is not reacted and qualities are not deteriorated.

Depending on end use, the epoxy resin composition obtainable in the present invention can be used without removing the organic mediums (C) and (D), and also in this case, the rubber-like polymer particles (B) can be dispersed without agglomeration in a solution of the epoxy resin (A) in the mixed organic medium of the remaining organic mediums (C) and (D). The amount of the remaining organic mediums (C) and (D) in the epoxy resin composition can be selected in a proper range, depending on the use of the epoxy resin composition.

Another aspect of the present invention is that contaminants such as an emulsifier used generally in production of the rubber-like polymer particle (B) latex and capable of exerting a harmful influence on the epoxy resin (A) can be easily removed. In a more preferable embodiment of the present invention, the contaminants can be reduced or removed by extracting the contaminants from the resulting dispersion (F) into the aqueous layer by washing with water at least once prior to mixing the dispersion (F) with the epoxy resin (A). When higher degree of removal of the contaminants is necessary, the mixture (E) can be washed with water at least once after the mixture (E) is obtained by contacting and mixing the rubber-like polymer particles (B) with the organic medium (C) and before the organic medium (D) is contacted and mixed with the mixture (E).

The temperature at which the organic medium (C) is mixed with the rubber-like polymer particles (B) should be adjusted in such a range that the effect of the present invention is not deteriorated, because the partial solubility can be changed depending on the type of the organic solvent (C) to change the partial solubility in water. By utilizing such aspect, the temperature can be suitably adjusted to separate the organic layer from the aqueous layer in a preferable state.

In the present invention as described above, when the rubber-like polymer particles (B) are to be mixed and dispersed in the epoxy resin (A), the rubber-like polymer particles (B) are extracted efficiently as dispersion (F) containing the polymer particles dispersed stably in the organic medium, without isolating the rubber-like polymer particles (B) as a coagulated material, whereby the rubber-like polymer particles (B) can be dispersed in the epoxy resin (A) while maintaining a fine dispersion thereof without requiring strong mechanical stirring etc. Further, the amount of water to be separated from the mixture of the epoxy resin (A) and rubber-like polymer particles (B) can be suppressed significantly as compared with a conventional method, thus bringing about an industrial advantage in production efficiency. In the procedure, it is not necessary to add water-soluble electrolytes which can be contaminants, and an emulsifier added to the rubber-like polymer particles (B), and contaminants such as ionic compounds and water-soluble compounds can be easily reduced or removed.

The epoxy resin composition produced by the method of the present invention described above can be applied in various uses where epoxy resin is usually used, for example in paints, coating agents, fiber or filler-reinforced composite materials such as aircraft parts, sporting goods, or structural materials, adhesives, binding agents, and electronic materials such as semiconductor sealant or electronic circuit substrate, by substituting the composition of the present invention for a part or the whole of the epoxy resin, to give a cured product with excellent in stability of the dispersed state of the rubber-like polymer particles (B) and less contaminant in the epoxy resin composition or in the cured product.

EXAMPLES

The present invention is described in detail by reference to the Examples, but the present invention is not limited thereto. Unless otherwise specified, the terms "parts" and "%" in the Examples and Comparative Examples refer to "parts by weight" and "% by weight", respectively.

The meanings of abbreviations are as follows:
MEK: methyl ethyl ketone
MIBK: methyl isobutyl ketone First, the analytical measurement methods described in the Examples are described below.

[1] Quantification of the Rubber-like Polymer Particle (B) Component Contained in the Aqueous Layer A part of the aqueous layer discharged by a method described in the Examples and Comparative Examples was taken and dried sufficiently at 120° C., and the amount of methanol-insoluble components in the resulting residues was determined as the amount of the rubber-like polymer particle (B) component contained in the aqueous layer.

[2] Dispersed State of the Rubber-Like Polymer Particles (B) in the Epoxy Resin (a)

The epoxy resin composition obtained in each of the Examples and Comparative Examples was cured, and the cured product was observed under a transmission electron microscope (TEM) by an ultra-thin section method to judge the dispersed state of the rubber-like polymer particles (B).

[2-1] Curing of the Epoxy Resin Composition 25 g of epoxy resin composition obtained in each of the Examples and Comparative Examples was mixed with 75 g of the same epoxy resin (Epicote 821) and then mixed under stirring with 6 g of piperidine (manufactured by Tokyo Kasei Kogyo Co., Ltd.) as a curing agent. This mixture was left in a vacuum drying oven and defoamed first under a nitrogen atmosphere and then under reduced pressure at 60° C. for 10 minutes. Thereafter, this mixture was poured into a mold of 100×150×3 mm in dimensions and maintained at 120° C. for 16 hours to give a cured product.

[2-2] Observation of the Dispersed State of the Rubber-like Polymer Particles (B) Under a Transmission Electron Microscopy A part of the resulting molded product was cut off, and after the rubber-like polymer particles (B) were stained with osmium oxide, a thin section was cut therefrom and observed at 40,000× magnification under a transmission electron microscope (JEM-1200EX manufactured by JEOL, Ltd.), and the dispersed state of the rubber-like polymer particles (B) in the epoxy resin cured product was evaluated by using as an indicator of particle dispersion ratio (%) calculated by the following method.

Good: particle dispersion ratio was 90% or more.
Not good: particle dispersion ratio was less than 90%.

[2-3] Calculation of the Particle Dispersion Ratio

In the obtained TEM photograph, four squares of 5 cm in side were selected at random, and the total number $B_0$, of rubber-like polymer particles (B) and the number $B_1$ of rubber-like polymer particles (B) in the form where three or more polymer particles were contacted with one another (when a certain rubber-like polymer particle (B) is contacted with "n" polymer particles, the number of polymer particles contacted with one another was regarded as "n") were determined, and the particle dispersion ratio was calculated according to the following equation:

$$\text{Particle dispersion ratio}(\%) = (1-(B_1/B_0)) \times 100$$

[3] Amount of the Remaining Emulsifier

The amount of the remaining emulsifier was determined by measuring the amount of the emulsifier remaining in the dispersion (F) before mixing with the epoxy resin (A) and then expressing the amount as a ratio (% by weight) relative to the amount (=100% by weight) of the emulsifier used in polymerization of the rubber-like polymer particles (B).

[3-1] Sample Pretreatment

In a method described in the Examples, 5 ml dispersion (F) before mixing with the epoxy resin (A) was collected, evaporated into dryness, introduced together with 50 ml ethanol into a beaker, and stirred for 10 minutes, and the supernatant was used as a sample to be analyzed by a methylene blue method.

[3-2] Methylene Blue Method 30 ml water, 10 ml alkaline sodium borate solution and 5 ml methylene blue solution (0.025% aqueous solution) were introduced into a separatory funnel. 20 ml chloroform was added thereto and shaken for 3 to 5 minutes, to separate and remove a chloroform layer. The above procedure of adding and removing chloroform was repeated until coloration of the chloroform layer disappeared. Then, 3 ml dilute sulfuric acid (2.9% aqueous solution), 20 ml chloroform and 2 ml of the sample prepared in (1) were added thereto and shaken for 3 to 5 minutes, and the chloroform layer was measured for its absorption at 650 nm with a spectrophotometer (spectrophotometer UV-2200 manufactured by Shimadzu Corporation) to determine the amount of the emulsifier remaining in the dispersion (F) before mixing with the epoxy resin (A). The alkaline-sodium borate solution was prepared by mixing 500 ml of 0.4% sodium hydroxide with 500 ml of 1.9% aqueous sodium tetraborate·10H$_2$O.

[4] Epoxy Equivalent Value (EEW)

The epoxy equivalent value (EEW) of the epoxy resin composition obtained in a method described in the Examples was measured according to JIS K-7236.

Hereinafter, examples of the process for producing the reinforced epoxy resin composition of the present invention are described.

Production Example 1

Production of Rubber-like Polymer Particles (B)

200 parts of water, 0.03 part of tripotassium phosphate, 0.25 part of potassium dihydrogen phosphate, 0.002 part of ethylenediaminetetraacetic acid, 0.001 part of ferrous sulfate and 1.5 parts of sodium dodecylbenzenesulfonate were introduced into a 100 L pressure-resistant polymerization vessel and purged sufficiently with nitrogen under stirring to remove oxygen, and then 75 parts of butadiene and 25 parts of styrene were introduced into the system and heated to 45° C. polymerization was initiated by introducing 0.015 part of p-menthane hydroperoxide and then 0.04 part of sodium formaldehyde sulfoxylate. Four hours after the polymerization was initiated, 0.01 part of p-menthane hydroperoxide, 0.0015 part of ethylenediaminetetraacetic acid and 0.001 part of ferrous sulfate were introduced. Ten hours after initiation of the polymerization, the remaining monomer was removed by volatilization under reduced pressure to terminate the polymerization. The polymerization conversion ratio was 98%, and the average particle diameter of the resulting styrene-butadiene rubber latex was 0.1 μm.

1300 g of the above rubber latex (containing 420 g of styrene-butadiene rubber particles and containing an emulsifier sodium dodecylbenzenesulfonate in an amount of 1.5% by weight relative to the solids content of the rubber) and 440 g of pure water were introduced into the system, and the mixture was purged with nitrogen and stirred at 70° C. After 1.2 g of azobisisobutyronitrile (AIBN) was added, a mixture of 54 g of styrene, 72 g of methyl methacrylate, 36 g of acrylonitrile and 18 g of glycidyl methacrylate was added continuously over 3 hours and graft-polymerized. After this addition, the mixture was stirred for additional 2 hours to terminate the reaction, to give the latex of rubber-like polymer particles (B). The polymerization conversion ratio was 99.5%. The resulting latex was used as it was.

Example 1

Production of a Modified Epoxy Composition 500 g of methyl ethyl ketone (hereinafter referred to as MEK; water solubility at 25° C., 11% by weight) was introduced as an organic medium (C) component into a 3-L glass vessel kept at 25° C., and 420 g of the aqueous latex of rubber-like polymer particles (B) obtained in production Example 1 was added thereto and stirred. 450 g of methyl isobutyl ketone (hereinafter referred to as MIBK; water solubility at 25° C., 2% by weight) was added as an organic medium (D) to the resulting mixture (E) of the rubber-like polymer particles (B) and the organic medium (C) under stirring. Separation of water from the mixed organic medium layer was observed. After addition of MIBK, 210 g of water was added thereto and stirred. After stirring was terminated, the mixture was left for 30 minutes, the aqueous layer was discharged, and the dispersion (F) was recovered. The discharged aqueous layer was 460 g. In the separated aqueous layer, the rubber-like polymer particles (B) were not recognized.

Then, the resulting dispersion (F) was mixed with 340 g of epoxy resin (A) (Epicote 828 (™, manufactured by Japan Epoxy resin Co., Ltd.)), and then volatile components were distilled away at 80° C. for 4 hours under reduced pressure, to give an epoxy resin composition having the rubber-like polymer particles (B) dispersed in the epoxy resin (A). In this mixing of the dispersion (F) with the epoxy resin (A), shaking mixing was used and strong mechanical stirring (stirring under high shear) was not required.

The dispersed state of the rubber-like polymer particles (B) in a cured product obtained from the epoxy resin composition was observed, and as a result, the rubber-like polymer particles (B) were uniformly dispersed without agglomeration. The epoxy value (EEW) was 245 g/eq.

Comparative Example 1-1

500 g of methyl ethyl ketone (MEK) was introduced as an organic medium (C) into a 3-L glass vessel kept at 25° C., and 420 g of the aqueous latex of rubber-like polymer particles (B) obtained in production Example 1 was added thereto and stirred. 450 g of MEK was added again to the resulting mixture (E) under stirring. After addition of MEK, 210 g of water was added thereto and stirred. Stirring was terminated and the mixture was left for 30 minutes. Unlike Example 1, it was observed that an aqueous layer was hardly formed, and the organic medium layer had been emulsified to indicate that a large amount of water was contained. It was revealed that the efficiency of water separation was worse than in the corresponding Example 1.

The same procedure as in Example 1 was carried out in attempting to obtain an epoxy resin composition having the rubber-like polymer particles (B) mixed in the epoxy resin (A), but a large amount of water remained in the epoxy resin, and the desired epoxy resin composition as shown in Example 1 could not be obtained.

Comparative Example 1-2

500 g of methyl ethyl ketone (MEK) was introduced as an organic medium (C) into a 3-L glass vessel kept at 25° C., and 420 g of the aqueous latex of rubber-like polymer particles (B) obtained in production Example 1 was added thereto and stirred. 210 g of water was added to the resulting mixture (E) under stirring. Stirring was terminated and the mixture was left for 30 minutes. It was observed that an aqueous layer was hardly formed, and the organic medium layer had been emulsified to indicate that a large amount of water was contained. It was revealed that the efficiency of water separation was worse than in the corresponding Example 1.

Comparative Example 1-3

500 g of methyl ethyl ketone (MEK) was introduced as an organic medium (C) into a 3-L glass vessel kept at 25° C., and 420 g of the aqueous latex of rubber-like polymer particles (B) obtained in production Example 1 was added thereto and stirred. Stirring was terminated and the mixture (E) was left for 12 hours. The mixture (E) had been emulsified, the progress of water separation was hardly observed, and an aqueous layer was not formed.

TABLE 1

|  | Example 1 | Comparative Example 1-1 | Comparative Example 1-2 | Comparative Example 1-3 |
|---|---|---|---|---|
| Organic solvent (C) | MEK | MEK | MEK | MEK |
| Solubility of water in organic solvent (C) | 11% | 11% | 11% | 11% |
| Amount of introduced (C) | 500 g | 500 g | 500 g | 500 g |
| Amount of introduced (B) | 420 g | 420 g | 420 g | 420 g |
| Amount of added water | — | — | — | — |
| Organic solvent (D) | MIBK | MEK | — | — |
| Solubility of water in organic solvent (D) | 2% | 11% | — | — |
| Amount of added (D) | 450 g | 450 g | — | — |
| Number of times dispersion (F) was washed with water <amount of added water> | 1 <210 g> | 1 <210 g> | 1 <210 g> | none |
| Water separability after left | good | not good | not good | not good |
| Content of rubber-like polymer particles (B) in aqueous layer | not detected | — | — | — |
| Dispersed state of rubber-like polymer particles (B) in a cured product of epoxy resin composition | good | — | — | — |

Example 2

252 g of aqueous latex of rubber-like polymer particles (B) was mixed in a mixed solvent of 306 g of methyl ethyl ketone (MEK) and 34 g of methyl isobutyl ketone (MIBK) (solubility of water in the mixed solvent at 25° C., 10% by weight) as an organic medium (C) under stirring with a stirring blade with a 3-tiered paddle wing in a 1 L mixing vessel kept at 25° C., 126 g of water was added thereto and stirred. While the resulting mixture (E) was stirred, 340 g of MIBK was added thereto as organic medium (D). Stirring was terminated, then the mixture was left for 30 minutes, the aqueous layer was discharged, and the dispersion (F) was recovered. In the discharged aqueous layer, the rubber-like polymer particles (B) were not recognized, and the rubber-like polymer particles (B) could be completely extracted in the organic medium layer.

In the same manner as in Example 1, the resulting dispersion (F) was mixed with 204 g of epoxy resin (Epicote 828), and then volatile components were distilled away under reduced pressure, whereby an epoxy resin composition was obtained.

The dispersed state of the rubber-like polymer particles (B) in a cured product obtained from the epoxy resin composition was observed, and as a result, the rubber-like polymer particles (B) were uniformly dispersed without agglomeration. The amount of the emulsifier remaining in the dispersion (F) was 49% by weight based on the amount of the emulsifier added at the time of production of the rubber-like polymer particle (B) latex.

Comparative Example 2-1

340 g of methyl isobutyl ketone (solubility of water at 25° C., 2.0% by weight) was introduced as an organic medium into a 1 L mixing vessel kept at 25° C., and 252 g of the aqueous latex of rubber-like polymer particles (B) obtained in Production Example 1 was mixed therein under stirring with a stirring blade with a 3-tiered paddle wing. 126 g of water was added thereto and stirred. After stirring was terminated, the separation of the MIBK layer from the aqueous layer could be confirmed, but the rubber-like polymer particles (B) were not present in the MIBK layer, and the rubber-like polymer particles (B) could not be extracted in the MIBK layer.

Comparative Example 2-2

340 g of acetone (water-soluble solvent dissolved mutually in water in an arbitrary ratio, that is, having a water solubility of ∞ at 25° C.) was introduced into a 1 L mixing vessel kept at 25° C., and 252 g of the aqueous latex of rubber-like polymer particles (B) obtained in production Example 1 was mixed therein under stirring with a stirring blade with a 3-tiered paddle wing. The rubber-like polymer particles (B) were agglomerated to generate a large number of large agglomerated materials to make stirring difficult.

Example 3

A mixed solvent of 288 g of methyl ethyl ketone and 52 g of methyl isobutyl ketone (solubility of water in the mixed solvent at 25° C., 9.2% by weight) was introduced as the organic medium (C) into a 1 L mixing vessel kept at 25° C., and 252 g of the aqueous latex of rubber-like polymer particles (B) obtained in Production Example 1 was mixed therein under stirring with a stirring blade with a 3-tiered paddle wing. 126 g of water was added thereto and stirred. 340 g of MIBK was added as the organic medium (D) into the resulting mixture (E) under stirring. After stirring was terminated, the mixture was left for 30 minutes, the aqueous layer was discharged, and the dispersion (F) was obtained. The content of the rubber-like polymer particles (B) in the aqueous layer was 1.2% by weight.

TABLE 2

|  | Example 2 | Comparative Example 2-1 | Comparative Example 2-2 | Example 3 |
|---|---|---|---|---|
| Organic solvent (C) | MEK (90) MIBK (10) | MIBK | acetone | MEK (84.7) MIBK (15.3) |
| Solubility of water in organic solvent (C) | 10% | 2.0% | ∞ | 9.2% |
| Amount of introduced (C) | 340 g | 340 g | 340 g | 500 g |
| Amount of introduced (B) | 252 g | 252 g | 252 g | 420 g |
| Amount of added water | 126 g | 126 g | — | 126 g |
| Organic solvent (D) | MIBK | — | — | MIBK |
| Solubility of water in organic solvent (D) | 2% | — | — | 2% |
| Amount of added (D) | 340 g | — | — | 340 g |
| Number of times dispersion (F) was washed with water <amount of added water> | none | none | none | none |
| Water separability after left | good | good | not good infeasible stirring due to flocculation of (B) | good |
| Content of rubber-like polymer particles (B) in aqueous layer | not detected | 100% by weight | — | 1.2% by weight |
| Amount of the remaining emulsifier in dispersion (F) | 49% | — | — | — |
| Dispersed state of rubber-like polymer particles (B) in a cured product of epoxy resin composition | good | — | — | — |

Example 4

365 g of methyl ethyl ketone (MEK) (solubility of water at 25° C., 11% by weight) was introduced as the organic medium (C) into a 1 L glass vessel at room temperature, and 252 g of the aqueous latex of rubber-like polymer particles (B) obtained in production Example 1 was mixed therewith under stirring. 400 g of methyl isobutyl ketone (MIBK) was added as the organic medium (D) to the resulting mixture (E) under stirring. 252 g of water was added thereto and stirred. After stirring was terminated, the mixture was left for 30 minutes, the aqueous layer was discharged, and the dispersion (F) was obtained. In the discharged aqueous layer, the rubber-like polymer particles (B) were not contained. Again, 400 g of water was added to and mixed with the dispersion (F). After the mixture was left for 60 minutes, the aqueous layer was discharged and the dispersion (F) was obtained. In the discharged aqueous layer, the rubber-like polymer particles (B) were not contained either.

In the same manner as in Example 1, the resulting dispersion (F) was mixed with 204 g of epoxy resin (Epicote 828), and then volatile components were distilled away under reduced pressure, whereby an epoxy resin composition was obtained.

The dispersed state of the rubber-like polymer particles (B) in a cured product obtained from the epoxy resin composition was observed, and as a result, the rubber-like polymer particles (B) were uniformly dispersed without agglomeration. The amount of the emulsifier remaining in the dispersion (F) was 26% by weight based on the amount of the emulsifier added to the latex.

Example 5

340 g of methyl ethyl ketone (MEK) was introduced into a 1 L mixing container kept at 25° C., and 252 g of the aqueous latex of rubber-like polymer particles (B) obtained in production Example 1 was mixed therewith under stirring with a stirring blade with a 3-tiered paddle wing, and then stirring was terminated. 126 g of water was added thereto and stirred. 400 g of methyl isobutyl ketone was added as the organic medium (D) to the resulting mixture (E) under stirring. After stirring was terminated, the mixture was left for 30 minutes, the aqueous layer was discharged, and the dispersion (F) was obtained. In the discharged aqueous layer, the rubber-like polymer particles (B) were not contained. Again, 400 g of water was added to and mixed with the dispersion (F). After the mixture was left for 60 minutes, the aqueous layer was discharged and separated from the dispersion (F). In the discharged aqueous layer, the rubber-like polymer particles (B) were not contained either.

In the same manner as in Example 1, the resulting dispersion (F) was mixed with 204 g of epoxy resin (Epicote 828), and then volatile components were distilled away under reduced pressure, whereby an epoxy resin composition was obtained.

The dispersed state of the rubber-like polymer particles (B) in a cured product obtained from the epoxy resin composition was observed, and as a result, the rubber-like polymer particles (B) were uniformly dispersed without agglomeration. The amount of the emulsifier remaining in the dispersion (F) was 32% by weight based on the amount of the emulsifier added at the time of production of the rubber-like polymer particle (B) latex.

Example 6

340 g of methyl ethyl ketone (MEK) was introduced as the organic medium (C) into a 1 L mixing vessel kept at 25° C., and 252 g of the aqueous latex of rubber-like polymer particles (B) obtained in production Example 1 was mixed therewith under stirring with a stirring blade with a 3-tiered paddle wing, and then stirring was terminated. 126 g of water was added thereto and stirred. 400 g of methyl isobutyl ketone was added as the organic medium (D) to the resulting mixture (E) under stirring. The mixture was left for 30 minutes, and the aqueous layer was discharged and separated from the dispersion (F). In the discharged aqueous layer, the rubber-like polymer particles (B) were not contained. Again, 250 g of water was added to and mixed with the dispersion (F) and left for 30 minutes, and then the aqueous layer was discharged and separated from the dispersion (F). In the discharged aqueous layer, the rubber-like polymer particles (B) were not contained either. Further, 250 g of water was added thereto and stirred, the mixture was left for 30 minutes without stirring, and the aqueous layer was discharged and the dispersion (F) was obtained. In the discharged aqueous layer, the rubber-like polymer particles (B) were not contained either.

In the same manner as in Example 1, the resulting dispersion (F) was mixed with 204 g of epoxy resin (Epicote 828), and then volatile components were distilled away under reduced pressure, whereby an epoxy resin composition was obtained.

The dispersed state of the rubber-like polymer particles (B) in a cured product obtained from the epoxy resin composition was observed, and as a result, the rubber-like polymer particles (B) were uniformly dispersed as primary particles without agglomeration. The amount of the emulsifier remaining in the dispersion (F) was 10% by weight based on the amount of the emulsifier added at the time of production of the rubber-like polymer particle (B) latex. The epoxy value (EEW) was 248 g/eq.

Example 7

340 g of methyl ethyl ketone (MEN) was introduced into a 1 L mixing container kept at 25° C., and 252 g of the aqueous latex of rubber-like polymer particles (B) obtained in production Example 1 was mixed therewith under stirring with a stirring blade with a 3-tiered paddle wing, and then stirring was terminated. 126 g of water was added thereto and stirred. 400 g of ethyl acetate (solubility of water at 25° C., 3.4% by weight) was added as the component (D) to the resulting organic layer (E) under stirring. After the mixture was left for 30 minutes, the aqueous layer was discharged and separated from the dispersion (F). In the discharged aqueous layer, the rubber-like polymer particles (B) were not contained. The dispersion (F) was left for 30 minutes, and then the aqueous layer was discharged and separated from the dispersion (F). In the discharged aqueous layer, the rubber-like polymer particles (B) were not contained either.

In the same manner as in Example 1, the resulting dispersion (F) was mixed with 204 g of epoxy resin (Epicote 828), and then volatile components were distilled away under reduced pressure, whereby an epoxy resin composition was obtained.

The dispersed state of the rubber-like polymer particles (B) in a cured product obtained from the epoxy resin composition was observed, and as a result, the rubber-like polymer particles (B) were uniformly dispersed as primary particles without agglomeration. The amount of the emulsifier remaining in the dispersion (F) was 32% by weight based on the amount of the emulsifier added at the time of production of the rubber-like polymer particle (B) latex.

TABLE 3

|  | Example 4 | Example 5 | Example 6 | Example 7 |
|---|---|---|---|---|
| Organic solvent (C) | MEK | MEK | MEK | MEK |
| Solubility of water in organic solvent (C) | 11% | 11% | 11% | 11% |
| Amount of introduced (C) | 340 g | 340 g | 340 g | 340 g |
| Amount of introduced (B) | 252 g | 252 g | 252 g | 252 g |
| Amount of added water | — | 126 g | 126 g | 126 g |
| Organic solvent (D) | MIBK | MIBK | MIBK | ethyl acetate |
| Solubility of water in organic solvent (D) | 2% | 2% | 2% | 3.4% |
| Number of times dispersion (F) was washed with water <amount of added water> | 2 <252 g/ 400 g> | 1 <252 g> | 2 <252 g/ 252 g> | 1 <252 g> |
| Separability of (F) from the aqueous layer after left | good | good | good | good |
| Content of rubber-like polymer particles (B) in aqueous layer | not detected | not detected | not detected | not detected |
| Amount of the remaining emulsifier in dispersion (F) | 26% | 32% | 10% | 32% |
| Dispersed state of rubber-like polymer particles (B) in a cured product of epoxy resin composition | good | good | good | good |

INDUSTRIAL APPLICABILITY

By using the production process of the present invention, a rubber-modified epoxy resin composition excellent in the dispersed state of rubber-like polymer particles (B) and superior in qualities with less contaminant can be produced easily and efficiently.

The invention claimed is:
1. A process for producing a curable epoxy resin composition comprising polymer particles (B) and a curable epoxy resin (A),
   the polymer particles (B) comprising 5 to 50% by weight of a shell layer (B-2) and 50 to 95% by weight of a rubber particle core (B-1), and the polymer particles (B) being in an independently dispersed state of substantially primary particles in the epoxy resin (A);

the process comprising the steps of bringing an organic medium (C) showing partial solubility in water into contact with an aqueous latex of polymer particles (B), then bringing an organic medium (D) having lower partial solubility in water than that of (C) into contact therewith to separate an aqueous layer substantially from the polymer particles (B), discharging the aqueous layer to obtain a dispersion (F) consisting essentially of the polymer particles (B) and the mixed organic mediums (C) and (D), without isolating the polymer particles (B) as a coagulated material, dissolving a curable epoxy resin (A) in the dispersion (F), and removing volatile components; and the polymer particles (B) being in an independently dispersed state of substantially primary particles in the dispersion (F).

2. The process for producing a curable epoxy resin composition according to claim 1, wherein after the organic medium (C) showing partial solubility in water is brought into contact with the aqueous latex of polymer particles (B) and then the organic medium (D) having lower partial solubility in water than that of (C) is brought into contact therewith to separate an aqueous layer substantially from the polymer particles (B), and before the dispersion (F) is mixed with the curable epoxy resin (A), the dispersion (F) is washed by bringing it at least once into contact with water.

3. The process for producing a curable epoxy resin composition according to claim 1, wherein the partial solubility of the organic medium (C) in water is defined as follows: a solubility of water in the organic medium (C) at 25° C. is 9 to 40% by weight.

4. The process for producing a curable epoxy resin composition according to claim 1, wherein the organic mediums (C) and (D) are a combination not forming two-component azeotropic mixture.

5. The process for producing a curable epoxy resin composition according to claim 1, wherein the polymer particles (B) are obtained by graft-polymerizing 5 to 50% by weight of the shell layer (B-2) comprising at least one monomer selected from the group consisting of (meth)acrylates, aromatic vinyls, vinyl cyanides, unsaturated acid derivatives, (meth)acrylamide derivatives and maleimide derivatives, with 50 to 95% by weight of the rubber particle core (B-1) comprising a rubber elastic body composed of not less than 50% by weight of at least one monomer selected from the group consisting of diene monomers and (meth)acrylate monomers and less than 50% by weight of another copolymerizable vinyl monomer, or a polysiloxane rubber elastic body, or a mixture thereof.

6. The process for producing a curable epoxy resin composition according to claim 5, wherein the shell layer (B-2) in the polymer particle (B) comprises a monomer having reactivity with an epoxy resin or a curing agent.

7. A curable epoxy resin composition obtained by the process described in claim 1.

8. A cured molded product comprising the curable epoxy resin composition of claim 7 cured with a curing agent.

9. A dispersion (F) consisting essentially of polymer particles (B) and mixed organic mediums (C) and (D), the polymer particles (B) comprising 5 to 50% by weight of a shell layer (B-2) and 50 to 95% by weight of a rubber particle core (B-1), and the polymer particles (B) being in an independently dispersed state of substantially primary particles in the dispersion (F);

wherein the dispersion (F) is obtained by bringing an organic medium (C) showing partial solubility in water into contact with an aqueous latex of polymer particles (B), bringing an organic medium (D) having lower partial solubility in water than that of (C) into contact therewith to separate an aqueous layer substantially from the polymer particles (B), and discharging the aqueous layer to obtain the dispersion (F) without isolating the polymer particles (B) as a coagulated material.

* * * * *